(12) United States Patent
Ito

(10) Patent No.: US 10,667,397 B2
(45) Date of Patent: May 26, 2020

(54) ELECTRONIC DEVICE HAVING A PLATED ANTENNA AND/OR TRACE, AND METHODS OF MAKING AND USING THE SAME

(71) Applicant: Mao Ito, Santa Cruz, CA (US)

(72) Inventor: Mao Ito, Santa Cruz, CA (US)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 15/780,217

(22) PCT Filed: Dec. 12, 2016

(86) PCT No.: PCT/US2016/066137
§ 371 (c)(1),
(2) Date: May 30, 2018

(87) PCT Pub. No.: WO2017/100752
PCT Pub. Date: Jun. 15, 2017

(65) Prior Publication Data
US 2018/0359858 A1 Dec. 13, 2018

Related U.S. Application Data

(60) Provisional application No. 62/266,323, filed on Dec. 11, 2015.

(51) Int. Cl.
*H05K 1/18* (2006.01)
*H01Q 1/38* (2006.01)
(Continued)

(52) U.S. Cl.
CPC .......... *H05K 1/181* (2013.01); *H01L 21/4867* (2013.01); *H01L 23/49822* (2013.01);
(Continued)

(58) Field of Classification Search
CPC .......... H05K 1/181; H05K 1/09; H05K 1/111; H05K 3/3436; H05K 2201/0338;
(Continued)

(56) References Cited

U.S. PATENT DOCUMENTS 5,892,661 A    4/1999 Stafford et al.
7,572,723 B2   8/2009 Mathew et al.
(Continued)

FOREIGN PATENT DOCUMENTS

DE    19731969 A1    8/1998
DE    102008017622 A1    10/2009
(Continued)

OTHER PUBLICATIONS

International Search Report of the International Searching Authority dated Jul. 6, 2017; International Application No. PCT/US2016/066137; 3 pgs.; International Searching Authority/US; Alexandria, Virginia.

(Continued)

*Primary Examiner* — Steven T Sawyer
(74) *Attorney, Agent, or Firm* — Andrew D. Fortney; Central California IP Group, P.C.

(57) ABSTRACT

An electronic device, and methods of manufacturing the same are disclosed. The method of manufacturing the electronic device includes forming a first metal layer on a first substrate, forming an integrated circuit or a discrete electrical component on a second substrate, forming electrical connectors on input and/or output terminals of the integrated circuit or discrete electrical component, forming a second metal layer on the first metal layer, the second metal layer improving adhesion and/or electrical connectivity of the first metal layer to the electrical connectors on the integrated (Continued)

circuit or discrete electrical component, and electrically connecting the electrical connectors to the second metal layer.

19 Claims, 6 Drawing Sheets

(51) Int. Cl.
| | |
|---|---|
| *H01L 23/498* | (2006.01) |
| *H01L 21/48* | (2006.01) |
| *H01Q 1/22* | (2006.01) |
| *H01Q 7/00* | (2006.01) |
| *H01L 23/00* | (2006.01) |
| *H05K 1/09* | (2006.01) |
| *H05K 1/11* | (2006.01) |
| *H05K 3/34* | (2006.01) |

(52) U.S. Cl.
CPC ........ *H01L 23/49855* (2013.01); *H01L 24/00* (2013.01); *H01Q 1/2225* (2013.01); *H01Q 1/38* (2013.01); *H01Q 7/00* (2013.01); *H05K 1/09* (2013.01); *H05K 1/111* (2013.01); *H05K 3/3436* (2013.01); *H05K 2201/0338* (2013.01); *H05K 2201/0347* (2013.01); *H05K 2201/09281* (2013.01); *H05K 2201/09772* (2013.01)

(58) Field of Classification Search
CPC . H05K 2201/0347; H05K 2201/09281; H05K 2201/09772; H05K 1/144
See application file for complete search history.

(56) References Cited

U.S. PATENT DOCUMENTS

| | | | |
|---|---|---|---|
| 8,298,680 | B2 | 10/2012 | Van Veen et al. |
| 9,490,795 | B1* | 11/2016 | Naviasky ............. H03K 17/145 |
| 2007/0004100 | A1 | 1/2007 | Maekawa et al. |
| 2007/0279230 | A1 | 12/2007 | Lakeman et al. |
| 2008/0223608 | A1* | 9/2008 | Nishimura ........ H01L 23/49838 |
| | | | 174/260 |
| 2009/0061561 | A1 | 3/2009 | Tanaka et al. |
| 2010/0221870 | A1 | 9/2010 | Maekawa et al. |
| 2011/0043431 | A1 | 2/2011 | Reinhold et al. |
| 2011/0074028 | A1* | 3/2011 | Pendse ................. H01L 21/563 |
| | | | 257/737 |
| 2011/0297426 | A1* | 12/2011 | Sunohara ............... H05K 3/388 |
| | | | 174/251 |
| 2014/0055974 | A1* | 2/2014 | Hansen .................. H05K 1/148 |
| | | | 361/804 |

FOREIGN PATENT DOCUMENTS

| | | |
|---|---|---|
| DE | 102012010560 A1 | 12/2013 |
| WO | 2005062388 A1 | 7/2005 |

OTHER PUBLICATIONS

International Preliminary Report on Patentability dated Jun. 21, 2018; International Application No. PCT/US2016/066137; 9 pgs.; The International Bureau of WIPO; Geneva, Switzerland.
Extended European Search Report dated Jun. 21, 2019; European Patent Application No. 16874040.5; 8 pages; European Patent Office, Munich, Germany.

* cited by examiner

ELECTRONIC DEVICE HAVING A PLATED ANTENNA AND/OR TRACE, AND METHODS OF MAKING AND USING THE SAME

CROSS REFERENCE TO RELATED APPLICATION

This application claims the benefit of U.S. Provisional Pat. Appl. No. 62/266,323, filed on Dec. 11, 2015, incorporated herein by reference as if fully set forth herein.

FIELD OF THE INVENTION

The present invention generally relates to the field(s) of electronic devices, and more specifically, to wireless communications and wireless devices. Embodiments of the present invention pertain to radio frequency (RF and/or RFID), near field communication (NFC), high frequency (HF), very high frequency (VHF), ultra high frequency (UHF), and electronic article surveillance (EAS) tags and devices having a layer of tin or other adhesion-promoting metal or alloy on an antenna and/or other metal trace(s) to improve adhesion and/or electrical connectivity of the antenna or metal trace(s) to an integrated circuit or other electrical component, and methods of manufacturing and using the same.

DISCUSSION OF THE BACKGROUND

Generally, smart labels consist of a variety of components such as a printed integrated circuit (PIC), a battery, and/or a display. Therefore, assembling conventional smart labels requires a variety of surface mounting (e.g., SMD, or "surface mounted device") techniques and materials, such as anisotropic conductive paste (ACP) and/or soldering.

Conventional printed backplanes may not meet resistivity requirements for high quality (Q) near field communication (NFC) labels, due to their limited thickness. Having a conventionally etched aluminum foil on a plastic film may provide relatively high Q NFC labels. However, the method of assembling an IC and a backplane with an aluminum trace is limited to the use of stud bumps and/or ACPs.

Typically, an etched copper foil on a plastic film, or an etched aluminum foil covered with a copper layer, provides a high Q NFC device that can be assembled using a variety of assembly techniques. However, copper is relatively expensive and is not compatible with food products.

Furthermore, tin immersion plating can deposit a thin layer of tin on the surface of copper or aluminum traces in discrete electrical components such as a switch or a contactor. However, use of such a technique in assembly of an IC or discrete electrical component to an antenna and/or metal traces on a backplane is not known.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

The present invention relates to electronic devices, more specifically wireless communications and wireless devices. Embodiments of the present invention pertain to radio frequency (RF and/or RFID), near field communication (NFC), high frequency (HF), very high frequency (VHF), ultra high frequency (UHF), and electronic article surveillance (EAS) tags and devices having a layer of tin or other adhesion-promoting metal or alloy on an antenna and/or metal trace(s) to improve adhesion and/or electrical connectivity of the antenna and/or trace(s) to an integrated circuit or other electrical component, and methods of manufacturing and using the same.

In one aspect, the present invention relates to a method of manufacturing an electronic device, comprising forming a first metal layer on a first substrate, forming an integrated circuit or discrete electrical component on a second substrate, forming electrical connectors on input and/or output terminals of the integrated circuit or discrete electrical component, forming a second metal layer on the first metal layer, and electrically connecting the electrical connectors to the second metal layer. The second metal layer improves adhesion and/or electrical connectivity of the first metal layer to the electrical connectors on the integrated circuit or discrete electrical component. The electronic device may be a wireless communication device.

In various embodiments of the present invention, the electronic device may be a wireless communication device. The wireless communication device may include a near field, radio frequency, high frequency (HF), very high frequency (VHF), or ultra high frequency (UHF) communication device.

In some embodiments of the present invention, the first substrate may include an insulative substrate selected from the group consisting of a polyimide, a poly(ethylene-vinyl alcohol), a glass/polymer laminate, or a high temperature polymer. The high temperature polymer may include polyethylene terephthalate [PET], polypropylene, or polyethylene naphthalate [PEN].

In exemplary embodiments of the present invention, forming the first metal layer may include depositing an aluminum layer on a first surface of the first substrate. The aluminum layer may have a thickness of at least 10 μm. In some embodiments, the aluminum layer may be etched to form an antenna and/or trace(s). The antenna may be configured to (i) receive and (ii) transmit or broadcast wireless signals.

In various embodiments of the present invention, forming the first metal layer may include printing a metal ink on the substrate in a pattern corresponding to the antenna and/or trace(s), and subsequently drying the metal ink and curing a metal or a metal precursor in the metal ink. Printing the metal ink, drying the metal ink and curing the metal or metal precursor may form a printed seed layer, and the method may further comprise electroplating or electrolessly plating a bulk metal on the printed seed layer. The antenna and/or trace(s) may consist of a single metal layer on the first substrate.

In various embodiments of the present invention, forming the first metal layer may include depositing an aluminum layer on first and second surfaces of the first substrate. In addition, forming the second metal layer may include depositing a layer comprising tin or a tin alloy on the first metal layer. Depositing the second metal layer may include an immersion plating process. In some embodiments of the present invention, the second metal layer may have a thickness of from 0.1 μm to 10 μm.

In exemplary embodiments of the present invention, forming the integrated circuit or discrete electrical component may include printing one or more layers of the integrated circuit or discrete electrical component on the second substrate. Thus, the present method may form a printed integrated circuit, in which case a plurality of the layers of the integrated circuit or discrete electrical component may be printed. Forming the printed integrated circuit may further include forming one or more layers of the integrated circuit by one or more thin film processing techniques. In some embodiments, forming the integrated circuit or discrete electrical component may include forming a plurality of layers of the integrated circuit or discrete electrical component by thin film processing techniques. When forming the integrated circuit, the input and/or output terminals may be formed in an uppermost metal layer of the integrated circuit. The input and/or output terminals may include antenna connection pads. In some embodiments of the present invention, an adhesive may be deposited on the input and/or output terminals. The adhesive may be or include an anisotropic conductive paste.

In various embodiments of the present invention, the electrical connectors may include a first solder bump or ball on a first input/output terminal of the integrated circuit and a second solder bump or ball on a second input/output terminal of the integrated circuit. Electrically connecting the electrical connectors to the second metal layer may include heating and pressing the first and second solder bumps or balls to the second metal layer at first and second locations on the second metal layer. The first input/output terminal may be at a first end of the integrated circuit, and the second input/output terminal may be at a second end of the integrated circuit opposite from the first end.

The present method may include forming one or more traces on the first substrate, and a sensor may be attached to at least one of the one or more traces. In some embodiments of the present invention, a battery may be attached to at least one of the one or more traces. In further embodiments, a display may be attached to at least one of the one or more traces. In exemplary embodiments of the present invention, forming the first and second metal layers may also form the one or more traces.

In various embodiments of the present invention, the discrete electrical component may be or include a capacitor, an inductor, a resistor, or a switch.

In another aspect, the present invention relates to an electronic device, comprising a substrate having a first metal layer thereon, an integrated circuit or discrete electrical component on a second substrate, the integrated circuit or discrete electrical component being configured to (i) process a first signal and/or information therefrom, and (ii) generate a second signal and/or information therefor, electrical connectors on input and/or output terminals of the integrated circuit or discrete electrical component, and a second metal layer on the first metal layer, the second metal layer configured to improve the adhesion and/or electrical connectivity of the first metal layer to the electrical connectors on the integrated circuit or discrete electrical component, the electrical connectors being electrically connected to the second metal layer. The first metal layer may comprise an antenna, and the electronic device may be a wireless communication device.

In various embodiments of the present device, the electronic device is a wireless communication device. As for the present method, the wireless communication device may be a near field (NFC), radio frequency (RF), high frequency (HF), very high frequency (VHF), or ultra high frequency (UHF) communication device.

In some embodiments of the present device, the first substrate may include an insulative substrate selected from the group consisting of a polyimide, a poly(ethylene-vinyl alcohol), a glass/polymer laminate, or a high temperature polymer. As for the present method, the high temperature polymer may include polyethylene terephthalate [PET], polypropylene, or polyethylene naphthalate [PEN].

In exemplary embodiments of the present device, the first metal layer may include an aluminum layer on a first surface of the first substrate. The aluminum layer may have a thickness of at least 10 µm. In some embodiments, the first metal layer is on first and second surfaces of the substrate. The first metal layer may include an antenna, and the antenna may be configured to (i) receive and (ii) transmit or broadcast wireless signals. The antenna may consists of a single metal layer. In various embodiments of the present device, the second metal layer may include a tin layer or a tin alloy layer. As for the present method, the tin layer or the tin alloy layer may have a thickness of from 0.1 µm to 10 µm.

In some embodiments of the present invention, the second substrate may include a metal foil having a diffusion barrier and/or insulator film thereon. The metal foil may include an aluminum or a stainless steel foil. Alternatively, the second substrate may include a plastic. The plastic may include polyethylene terephthalate (PET), polypropylene, poly(ethylene-vinyl alcohol), or polyethylene naphthalate (PEN).

In various embodiments, the integrated circuit may include a receiver and a transmitter. The transmitter may include a modulator and the receiver may include a demodulator. In some embodiments, the integrated circuit or discrete electrical component may include one or more printed layers. For example, the present device may include a printed integrated circuit, and the printed integrated circuit may include a plurality of printed layers. In other or further embodiments, the integrated circuit may include one or more thin films. For example, the integrated circuit may include a plurality of thin films. When the device includes an integrated circuit, input and/or output terminals may be in an uppermost metal layer of the integrated circuit. The input and/or output terminals may include antenna connection pads. Generally, the input and/or output terminals may include aluminum, tungsten, copper, silver, or a combination thereof In various embodiments, the electrical connectors may include a first solder bump or ball on a first input and/or output terminal of the integrated circuit and a second solder bump or ball on a second input and/or output terminal of the integrated circuit. In some embodiments, an adhesive may be on the first and second input and/or output terminals. The adhesive may include an anisotropic conductive paste. In further embodiments, the input/output terminal may be at a first end of the integrated circuit, and the second input/output terminal may be at a second end of the integrated circuit opposite the first end.

In various embodiments of the present invention, the discrete electrical component may include a capacitor, an inductor, a resistor, or a switch. Additionally or alternatively, the present device may include a sensor on the first substrate, which may be electrically connected to the integrated circuit or the discrete electrical component. In some embodiments, the device may include a battery on the first substrate, which may be electrically connected to the integrated circuit or the discrete electrical component. In further or other embodiments, the device may include a display on the first substrate, which may be electrically connected to the integrated circuit, the battery or the discrete electrical component. In some embodiments of the present invention, the first and second metal layers may include one or more traces electrically connecting the sensor, battery or display to the integrated circuit or discrete electrical component.

The present invention advantageously improves the mechanical smoothness of an antenna or metal trace on a backplane and the electrical contact between the antenna or trace and the integrated circuit or discrete electrical component. Additionally, the present invention reduces the cost and processing time of certain electronic devices, such as smart labels and NFC, RF, HF and UHF tags, and is compatible with food products. These and other advantages of the present invention will become readily apparent from the detailed description of various embodiments below.

DETAILED DESCRIPTION

Figure 1:
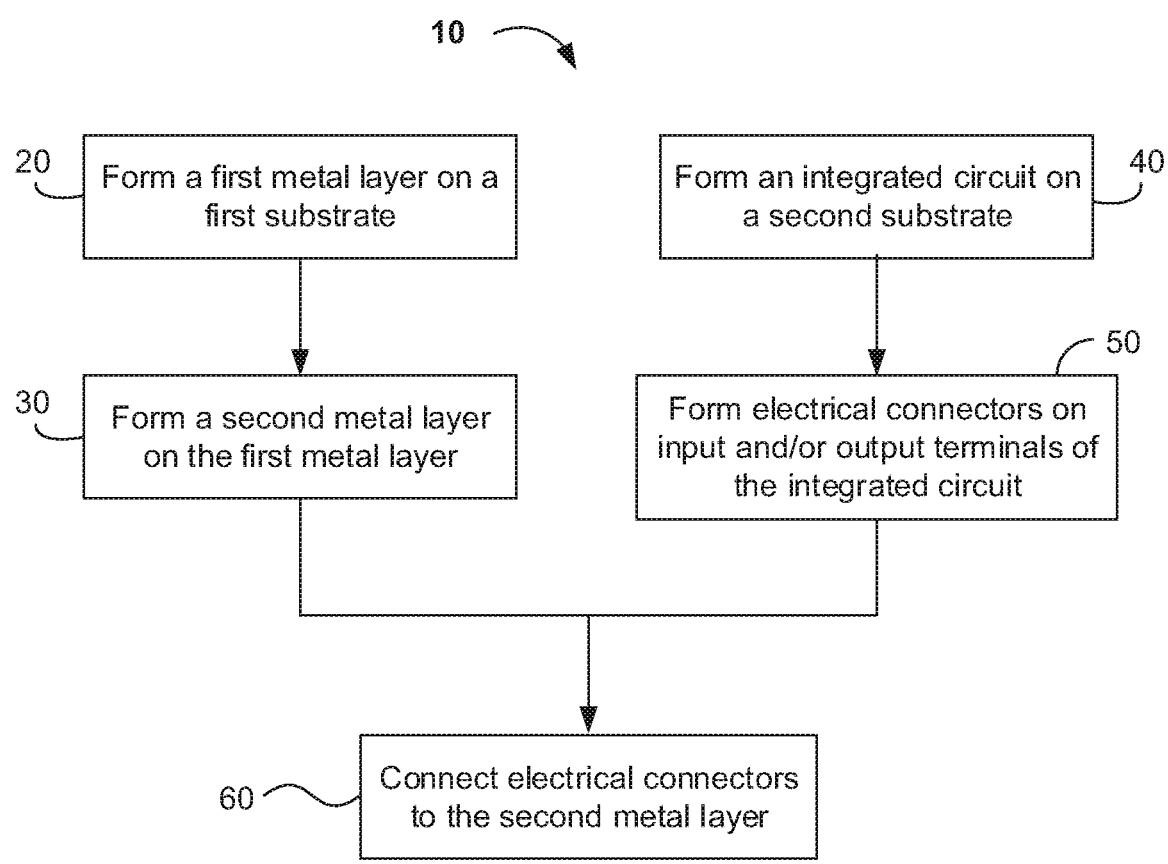
FIG. 1 shows a flow chart for an exemplary process for making electronic devices (e.g., wireless communication devices) having a layer of tin or other adhesion-promoting metal or alloy on an antenna and/or metal trace(s) in accordance with one or more embodiments of the present invention.

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and materials have not been described in detail so as not to unnecessarily obscure aspects of the present invention.

The technical proposal(s) of embodiments of the present invention will be fully and clearly described in conjunction with the drawings in the following embodiments. It will be understood that the descriptions are not intended to limit the invention to these embodiments. Based on the described embodiments of the present invention, other embodiments can be obtained by one skilled in the art without creative contribution and are in the scope of legal protection given to the present invention.

Furthermore, all characteristics, measures or processes disclosed in this document, except characteristics and/or processes that are mutually exclusive, can be combined in any manner and in any combination possible. Any characteristic disclosed in the present specification, claims, Abstract and Figures can be replaced by other equivalent characteristics or characteristics with similar objectives, purposes and/or functions, unless specified otherwise.

The present invention advantageously improves the mechanical smoothness of an antenna or metal trace on a backplane and the electrical contact between the antenna or trace and the integrated circuit. Additionally, the present invention reduces the cost and processing time of electronic devices such as smart labels and NFC, RF, HF and UHF tags, and is compatible with food products.

An Exemplary Method of Making an Electronic Device

The present invention concerns a method of manufacturing an electronic device, comprising forming a first metal layer on a first substrate, forming an integrated circuit or discrete electrical component on a second substrate, forming electrical connectors on input and/or output terminals of the integrated circuit or discrete electrical component, forming a second metal layer on the first metal layer, and electrically connecting the electrical connectors to the second metal layer. The second metal layer improves adhesion and/or electrical connectivity of the first metal layer to the electrical connectors on the integrated circuit or discrete electrical component. The electronic device may be a wireless communication device. In various embodiments, the wireless communications and wireless device comprises a radio frequency (RF and/or RFID), near field communication (NFC), high frequency (HF), very high frequency (VHF), ultra high frequency (UHF), or electronic article surveillance (EAS) tag and/or device. In one example, the device is an NFC device, such as an NFC tag, smart tag, or smart label.

FIG. 1 shows a flow chart for an exemplary process 10 for making electronic devices (e.g., wireless communication devices, more specifically NFC/RF tags) having a layer of tin or other adhesion-promoting metal or alloy on an antenna or metal trace, in accordance with one or more embodiments of the present invention. The tin (or other second metal) layer advantageously improves adhesion and/or electrical connectivity of the antenna or trace to the integrated circuit or discrete electrical component.

At 20, a first metal layer is formed on a first substrate. Forming the first metal layer may comprise depositing an aluminum layer (e.g., an aluminum foil) on a first surface of the first substrate. The aluminum layer may be coated or laminated on the first substrate (e.g., a wireless or display backplane), then etched to form the antenna and/or trace(s). Generally, the aluminum layer has a thickness of at least 10 µm. The aluminum layer can also include an aluminum alloy (e.g., with 0.1-5 wt or atomic % of one or more of copper, tin, silicon, etc.). In some embodiments, at least one trace is formed on the first substrate. Generally, when at least one trace is formed on the first substrate, a plurality of metal traces are formed. Forming the first metal layer may further comprise etching the coated or laminated aluminum layer to form an antenna and/or one or more traces on the backplane. Generally, the antenna is configured to (i) receive and (ii) transmit or broadcast wireless signals, and the trace(s) are configured to electronically connect an electrical device (e.g., the IC or electrical component) to one or more other components (e.g., a battery, display, one or more sensors, etc.).

In some embodiments, forming the antenna and/or trace(s) may consist of forming a single metal layer on the first substrate, patterning the metal layer, and etching the single metal layer to form the antenna and/or trace(s). Alternatively, forming the antenna and/or trace(s) may comprise printing a metal ink on the first substrate in a pattern corresponding to the antenna and/or trace(s), then drying the ink and curing a metal or metal precursor in the ink. Optionally, the method may further include reducing a metal precursor such as a metal salt or complex in the metal ink (e.g., by curing the metal salt or complex in a reducing atmosphere, such as forming gas). Additionally or alternatively, a bulk metal may be electroplated or electrolessly plated on a printed metal seed layer. An exemplary antenna thickness for HF devices may be about 20 µm to 50 µm (e.g., about 30 µm), and may be about 10 µm to about 30 µm (e.g., about 20 µm) for UHF devices.

In further embodiments, the aluminum layer is deposited and/or laminated on first and second surfaces of the first substrate. The aluminum layer on the second surface of the first substrate may be blanket deposited (e.g., coated and/or laminated) on the substrate. Alternatively, the aluminum layer on the second surface may be etched to form an antenna and/or trace(s) similar to the antenna/trace(s) on the first surface of the first substrate. One or more vias may be formed in the first substrate prior to deposition of the aluminum layer to provide an electrical connection between the antenna and/or trace(s) on the first surface of the substrate and the antenna and/or trace(s) on the second surface of the substrate.

In various embodiments, the first substrate may comprise an insulative substrate (e.g., plastic film or glass). For example, the insulative substrate may comprise a polyimide, a glass/polymer laminate, or a high temperature polymer. The high temperature polymer may consist of polyethylene terephthalate [PET], polypropylene, or polyethylene naphthalate [PEN].

At 30, a second metal layer is formed on the first metal layer. Typically, forming the second metal layer comprises depositing a layer comprising or consisting essentially of tin on the first metal layer. For example, the layer comprising tin may consist essentially of a tin alloy (e.g., tin with one or more alloying metals or elements selected from bismuth, silver, copper, zinc, and indium). In one embodiment, tin may be plated on the patterned aluminum. Preferably, plating the tin layer comprises an immersion plating process. The tin-containing layer may have a thickness of 0.1 µm to 10 µm, or any thickness or range of thicknesses therein. The second metal layer may also form an alloy or intermetallic interface with the first metal.

At 40, an integrated circuit or discrete electrical component is formed on a second substrate. In various embodiments, the integrated circuit may comprise a thin film integrated circuit or a printed integrated circuit (e.g., excluding a circuit formed on a monolithic single-crystal silicon wafer or die), and the discrete electrical component may comprise or consist of a capacitor, an inductor, a resistor, a switch, etc.

In various embodiments, the second substrate may comprise an insulative substrate (e.g., plastic film or glass). For example, an insulative substrate may comprise a polyimide, a glass/polymer laminate, or a high temperature polymer. The high temperature polymer may consists of polyethylene terephthalate [PET], polypropylene, or polyethylene naphthalate [PEN]. Alternatively, the second substrate may comprise a metal sheet, film or foil, or a laminate thereof. For example, the metal substrate may comprise a metal foil, such as aluminum or stainless steel foil, with one or more diffusion barrier and/or insulator films thereon. In one example, a stainless steel foil may have one or more diffusion barrier films such as a single or multilayer TiN, AlN or TiAlN film thereon, and one or more insulator films such as silicon dioxide, silicon nitride and/or a silicon oxynitride on the diffusion barrier film(s). The diffusion barrier film(s) may have a combined thickness of from 300Å to 5000Å (e.g., 300-950 Å, or any thickness or range of thicknesses between 300Å and 5000Å), and the insulator film(s) may have a combined thickness of from 200Å to 5000Å (e.g., 250-2000Å, or any thickness or range of thicknesses between 200Å and 5000Å). The insulator film(s) may have a thickness sufficient to electrically insulate electrical devices formed thereon from the underlying metal substrate and diffusion barrier layer(s).

Forming the integrated circuit or discrete electrical component may comprise printing one or more layers of the integrated circuit or discrete electrical component on the second substrate. An integrated circuit having one or more layers therein formed by printing may be considered to be a printed integrated circuit, or PIC.

In an exemplary method, a plurality of the layers of the integrated circuits may be printed, in which a lowermost layer (e.g., a lowermost insulator, conductor, or semiconductor layer) may be printed or otherwise formed on the second substrate. The lowermost layer of material is advantageously printed to reduce issues related to topographical variations in the integrated circuit layer(s) on the second substrate. Alternatively, a different (e.g., higher) layer may be printed. Printing offers advantages over photolithographic patterning processes, such as low equipment costs, greater throughput, reduced waste (and thus, a "greener" manufacturing process), etc., which can be ideal for relatively low transistor-count devices such as NFC, RF and HF tags.

In some examples, input and/or output terminals may be formed in an uppermost layer of the integrated circuit by a printing technique (e.g., screen printing, inkjet printing, gravure printing, etc.). The first input and/or output terminal may be at a first end of the integrated circuit, and the second input and/or output terminal may be at a second end of the integrated circuit opposite from the first end. In exemplary embodiments, the input and/or output terminals comprise first and second antenna connection pads. The material of the input and/or output terminals may include aluminum, tungsten, copper, silver, etc., or a combination thereof (e.g., a tungsten thin film on an aluminum pad).

Alternatively, the method may form one or more layers of the integrated circuit by one or more thin film processing techniques. Thin film processing also has a relatively low cost of ownership, and is a relatively mature technology, which can result in reasonably reliable devices being manufactured on a wide variety of possible substrates.

Thus, in some embodiments, the method may comprise forming a plurality of layers of the integrated circuity by thin-film processing techniques (e.g., blanket deposition, photolithographic patterning, etching, etc.). In an alternative example, the input and/or output terminals may be formed in an uppermost layer of the integrated circuit by thin-film processing.

In some embodiments, both printing and thin film processing can be used, and the method may comprise forming one or more layers of the integrated circuit by thin film processing, and printing one or more additional layers of the integrated circuit. In some embodiments, a plurality of integrated circuits may be formed on the second substrate.

At 50, electrical connectors may be formed on the input and/or output terminals of the integrated circuit. The electrical connectors may be formed, for example, by printing (e.g., screen printing) a paste of the electrical conductor material onto the input and/or output terminals. In various examples, the electrical connectors may comprise solder bumps or solder balls on the input and/or output terminals of the integrated circuit. A solder bump or solder ball material may include a solder alloy (e.g., tin and one or more alloying elements) being deposited on the input and/or output terminals. The alloying element(s) may be selected from bismuth, silver, copper, zinc, and indium. The solder bumps or solder balls may further contain an adhesive resin that may be activated by heating (e.g., to the solder reflow temperature or less), such as an epoxy resin. Some materials that include both a solder alloy and a resin include a SAM resin (e.g., SAM10 resin, available from Tamura Corporation, Osaka, JP) and/or self-alignment adhesives with solder (SAAS) and/or SAM resins that are commercially available from Panasonic Corporation, Tokyo, JP; Namics Corporation, Niigata City, JP; and Nagase & Co., Ltd., Tokyo, JP.

Typically, a first solder bump or solder ball is on a first input and/or output terminal, and a second solder bump or solder ball on a second input and/or output terminal. Thus, solder bumps or solder balls may be used to advantageously attach the integrated circuit or printed integrated circuit to the combined first and second metal (e.g., tin-coated or tin-plated aluminum) layers. In a further embodiment, an ACP may be deposited on the solder bumps or solder balls and/or areas of the input and/or output terminals not covered by the solder bumps or solder balls to further adhere and/or electrically connect the IC to the antenna and/or trace(s).

At 60, the electrical connectors are connected to the second metal layer. Electrically connecting the electrical connectors to the second metal layer may comprise heating and pressing the first and second solder bumps or balls to the second metal layer at first and second locations on the second metal layer. Pressure may be applied using a conventional bonder (e.g., available from Muhlbauer High Tech International, Roding, Germany) at a pressure of about 0.1N to about 50N (e.g., about 1N) for a second substrate having a surface area of about 0.5 mm$^2$ to about 10 mm$^2$ (e.g., 1.5 mm$^2$ to about 5 mm$^2$, and in one example, about 2.25 mm$^2$). When the antenna includes a bulk aluminum layer, the IC or discrete electrical component on the second substrate may be pressed into the antenna (on the first substrate) with a heated pressing tool. Thus, optionally, heating may be applied simultaneously with the pressure to the first and second substrates using a thermal head. The target temperature generally depends on the substrate materials, but can generally be from 50° C. to about 400° C. For example, when using a PET substrate, a maximum temperature of 190° C. should be used. However, 190° C. may also be a minimum temperature for curing certain adhesives, in which case a substrate that can tolerate higher temperatures should be used.

Prior to connecting the electrical connectors to the second metal layer, an adhesive may be deposited on the second metal layer. For example, the adhesive may include an anisotropic conductive paste.

When metal traces are formed on the first substrate, a sensor, a battery and/or a display may be attached to one or more of the traces (as may the IC) and electrically connected to the integrated circuit. Generally, each of the sensor, battery and/or display are connected to a unique trace or set of traces, each of which is also connected to one or more unique input and/or output terminals of the IC. The traces may be formed from the first or second metal layers. Furthermore, other components in addition to the sensor, battery, and/or display may be attached to the substrate and/or the tin or aluminum layer using any of a variety of surface mounted device (SMD) attachment techniques.

Figure 2A:
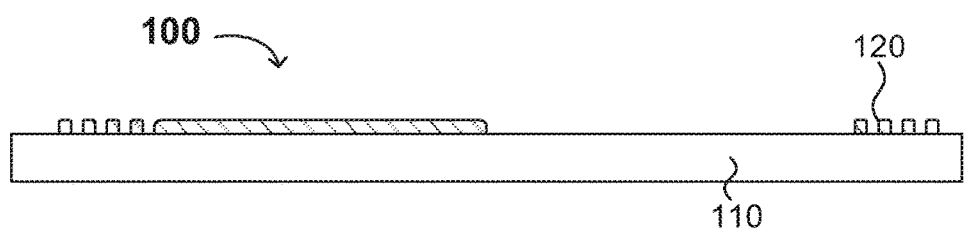
FIGS. 2A-2D show cross-sectional views of exemplary intermediates in the exemplary process.
Figure 2B:
Figure 2C:
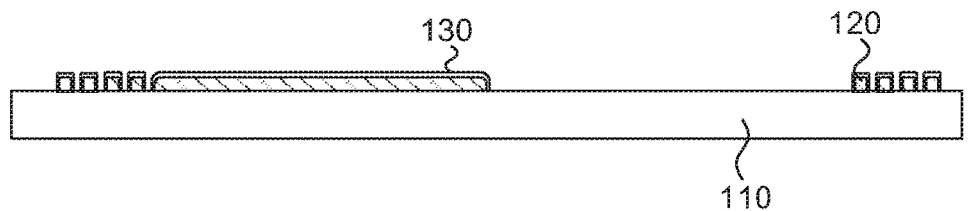
Figure 2D:
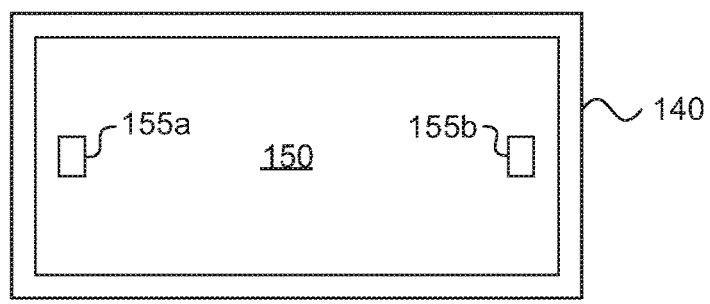
Figure 2E:
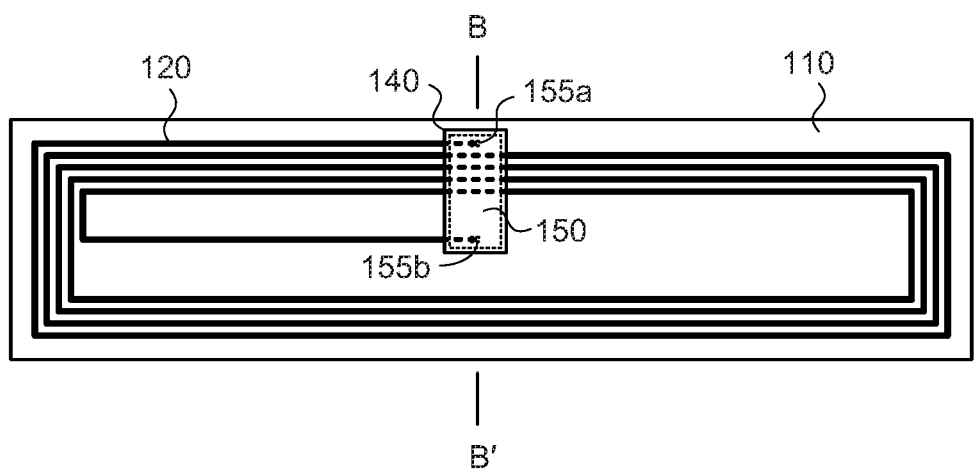
FIGS. 2E-2F shows a cross-sectional view of an exemplary electronic device having a layer of tin or other adhesion-promoting metal or alloy on an antenna and/or metal trace(s) in accordance with one or more embodiments of the present invention.
Figure 2F:
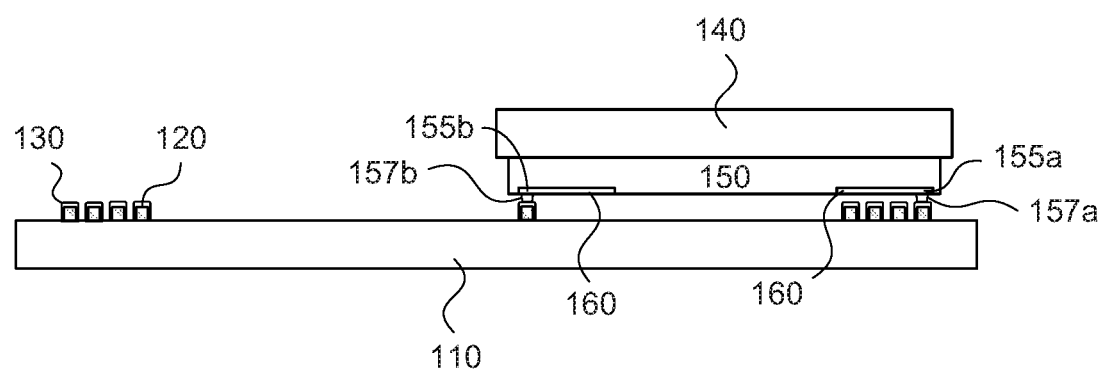

Exemplary Electronic Devices (and) Intermediates in an Exemplary Process for Manufacturing the Same FIGS. 2A-2D show plan and cross-sectional views of exemplary intermediates in the exemplary process, and FIGS. 2E-2F show plan and cross-sectional views of an exemplary electronic device having a surface layer of tin on an aluminum antenna, in accordance with one or more embodiments of the present invention. The electronic device generally includes a substrate having a first metal layer (e.g., aluminum) thereon, an integrated circuit or discrete electrical component on a second substrate, the integrated circuit or discrete electrical component being configured to (i) process a first signal and/or information therefrom, and (ii) generate a second signal and/or information therefor, electrical connectors on input and/or output terminals of the integrated circuit or discrete electrical component, and a second metal layer on the first metal layer, the second metal layer configured to improve the adhesion and/or electrical connectivity of the first metal layer to the electrical connectors, the electrical connectors being electrically connected to at least the second metal layer. In some embodiments, the integrated circuit may comprise a thin film integrated circuit or a printed integrated circuit (e.g., excluding a circuit formed on a monolithic single-crystal silicon wafer or die), and the discrete electrical component may comprise or consist of a capacitor, an inductor, a resistor, a switch, etc. In further or other embodiments, the electronic device is a wireless communication device.

FIG. 2A shows a first substrate 110 having a first metal layer 120 thereon. In various embodiments, the first substrate 110 may comprise an insulative substrate (e.g., plastic film or glass). For example, the insulative substrate 110 may comprise a polyimide, a glass/polymer laminate, or a high temperature polymer. The high temperature polymer may consist of polyethylene terephthalate [PET], polypropylene, or polyethylene naphthalate [PEN].

In various embodiments, the first metal layer 120 may comprise a patterned aluminum layer (e.g., a patterned aluminum foil) on a first surface of the first substrate 110. The aluminum layer may consist essentially of elemental aluminum or may comprise or consist essentially of an aluminum alloy (e.g., aluminum with one or more alloying elements such as copper, titanium, silicon, magnesium, manganese, tin, zinc, etc.). Generally, the aluminum layer 120 has a thickness of at least 10 μm.

FIG. 2B shows an antenna 120 formed from the first metal layer 120 of FIG. 2A. Generally, the antenna 120 is configured to (i) receive and (ii) transmit or broadcast wireless signals. In some embodiments, the antenna 120 may consist of a single metal layer on the first substrate 110. An exemplary antenna thickness for HF devices may be about 20 μm to 50 μm (e.g., about 30 μm), and may be about 10 μm to about 30 μm (e.g., about 20 μm) for UHF devices. Although FIG. 2B shows a spiral antenna having four loops, the spiral antenna may more than four loops or less than four loops, and the antenna may have any of several forms, such as serpentine, sheet or block (e.g., square or rectangular), etc.

In various embodiments, the antenna 120 may be a printed antenna (e.g., using a printed conductor such as, but not limited to, copper from a copper paste or ink) or a blanket-deposited and etched antenna (e.g., formed by sputtering or evaporating aluminum on a substrate such as a plastic film or sheet, patterning by printing a resist thereon or by low-resolution [e.g., 10-1,000 μm line width] photolithography, and wet or dry etching using the patterned resist as a mask). Alternatively, the antenna may comprise a laminated metal foil or a bulk metal plated on a printed seed metal layer. The laminated metal foil may include aluminum or copper foil. The bulk plated metal may include copper on a printed tin, aluminum or palladium seed layer. Alternatively, the antenna may comprise a printed silver antenna. The printed antenna (and/or any aluminum traces that may be present) may have a line width of from about 50 μm to about 5000 μm, and may have a crystal morphology (e.g., crystallinity) different from a blanket-deposited and photolithographically-defined and etched antenna, a more rounded cross-section than a blanket-deposited, photolithographically-defined and etched antenna, and/or a surface roughness, an edge uniformity and/or a line width uniformity that is generally greater than a blanket-deposited, photolithographically-defined and etched antenna. The antenna 120 may have a size and shape that matches any of multiple form factors, while preserving compatibility with the target frequency or a frequency specified by one or more industry standards (e.g., the 13.56 MHz target frequency of NFC reader hardware).

FIG. 2C shows a cross section along line A-A' in FIG. 2B, in which an exemplary second metal layer 130 is on the first metal layer 120. In exemplary embodiments, the second metal layer 130 comprises a tin layer on the first metal layer (e.g., aluminum layer) 120. In one embodiment, the tin layer 130 is deposited by an immersion plating process. Alternatively, the tin layer may be printed. In various embodiments, the tin layer may comprise or consist essentially of a tin alloy, as described herein. The second metal layer 130 may have a thickness of 0.1 μm to 10 μm.

FIG. 2D shows an integrated circuit 150 on a second substrate 140. In various embodiments, the second substrate 140 comprises a metal foil. In one example, the metal foil comprises a stainless steel foil, as described herein. Alternatively, the second substrate may comprise a plastic film or a glass sheet or slip, as described herein. When the integrated circuit is a wireless communication device, the integrated circuit 150 may comprise a receiver and/or transmitter. The transmitter may comprise a modulator configured to generate a wireless signal to be broadcast by the wireless communication device, and the receiver may comprise a demodulator configured to convert a received wireless signal to one or more electrical signals (e.g., to be processed by the integrated circuit 150).

In some embodiments, the integrated circuit 150 may include one or more printed layers. Such layers have characteristics of printed materials, such as greater dimensional variability, a thickness that varies (e.g., increases) as a function of distance from the edge of the printed structure, a relatively high surface roughness, etc. Additionally and/or alternatively, the integrated circuit 150 may (further) comprise one or more thin films (e.g., a plurality of thin films).

In exemplary embodiments, the uppermost metal layer 160 of the integrated circuit 150 may include input and/or output terminals 155a, 155b, as shown in FIG. 2F. Alternatively, the discrete electrical component may also include input and/or output terminals electrically connected to electrodes or electrode terminals of the discrete electrical component. In various embodiments, the input and/or output terminals 155a, 155b, may include antenna connection pads. The antenna connection pads (which may also be designated by the identifiers 155a, 155b) may comprise aluminum, tungsten, copper, silver, etc., or a combination thereof, and may have one or more barrier and/or adhesion-promoting layers thereon. For example, the antenna connection pads 155a, 155b may comprise a bulk aluminum layer with a thin tungsten adhesion and/or oxygen barrier layer thereon.

FIG. 2E shows the integrated circuit 150 on the second substrate 140 connected to the tin-plated antenna 120 on the first substrate 110. In some embodiments, electrical connectors 157a, 157b may be on input and/or output terminals of the integrated circuit 150. The first input and/or output terminal 155a may be at a first end of the integrated circuit 150, and the second input and/or output terminal 155b may be at a second end of the integrated circuit 150 opposite from the first end. In exemplary embodiments, the first and second antenna connection pads 155a, 155b and the integrated circuit 150 electrically connect the ends of the antenna 120. As a result, the second substrate 140 may function as an interposer that bridges the ends of the antenna 120 and provides an insulating mechanical support for the electrical component(s) that are electrically connected to the ends of the antenna 120.

FIG. 2F shows a cross-section along line B-B' of FIG. 2E, in which the tin-plated antenna 120/130 is attached to the integrated circuit 150, including electrical connectors 157a, 157b on the input and/or output terminals 155a, 155b. The input and/or output terminal 155a, 155b may be in the uppermost metal layer 160. The electrical connectors 157a, 157b may comprise solder bumps or solder balls on the input and/or output terminals 155a, 155b of the integrated circuit 150. Solder bumps or solder balls 157a, 157b may include a solder alloy (e.g., tin and one or more alloying elements as described herein) on the input and/or output terminals 155a, 155b. For example, the alloying elements for tin may be selected from bismuth, silver, copper, zinc, and indium. Typically, a first solder bump or solder ball 157a is on a first input and/or output terminal 155a, and a second solder bump or ball 157b is on a second input and/or output terminal 155b.

Methods of placing the integrated circuit 150 on or over the tin-plated antenna 120/130 include, but are not limited to, pick-and-place or roll-to-roll processing. Methods of attaching the integrated circuit 150 to the tin plated antenna 120/130 include, but are not limited to, crimping and/or applying an adhesive paste such as anisotropic conductive paste (ACP) to the antenna connection pads 155a, 155b solder and any solder bumps 157a, 157b thereon and/or a non-conductive paste (NCP) to the integrated circuit 150 in areas other than the antenna connection pads 155a, 155b. The method may further comprise applying pressure to the tin-plated antenna 120/130 and the integrated circuit 150, or applying pressure and heat to the tin-plated antenna 120/130 and the integrated circuit 150, as described herein.

In some embodiments, at least one trace (not shown) is also on the first substrate 110. A sensor, a battery and/or a display (not shown) may be attached to one or more of the traces and electrically connected to the integrated circuit 150 (and, optionally, to another of the sensor, battery and/or display, such as the battery). The traces may be formed from the first metal layer 120, and optionally, the second metal layer 130. The sensor may be configured to sense an environmental parameter, such as temperature or relative humidity, or a continuity state of packaging onto which the backplane 110, IC 150, and sensor are attached. The display may be a relatively simple monochromatic display, configured to display relatively simple data (e.g., a 2- or 3-digit number corresponding to the sensed parameter) and/or one of a limited number of messages (e.g., "Valid" or "Not Valid," depending on the value of the parameter relative to a predetermined minimum or maximum threshold, or "Sealed" or "Open," depending on the continuity state of the packaging). Furthermore, other components in addition to the sensor, battery, and/or display may be attached to the substrate and/or the tin-plated aluminum layer 120/130 using any of a variety of SMD techniques.

Figure 3A:
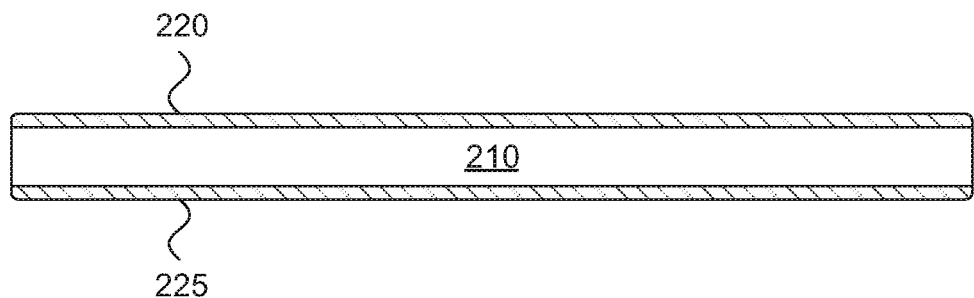
FIGS. 3A-3D show cross-sectional views of exemplary intermediates in another exemplary process.
Figure 3B:
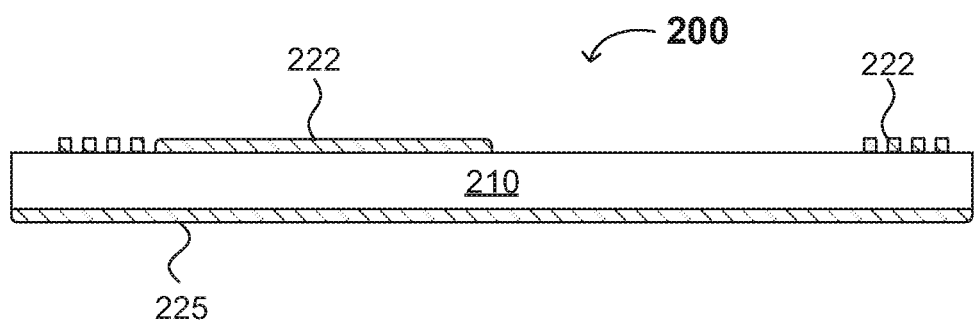
Figure 3C:
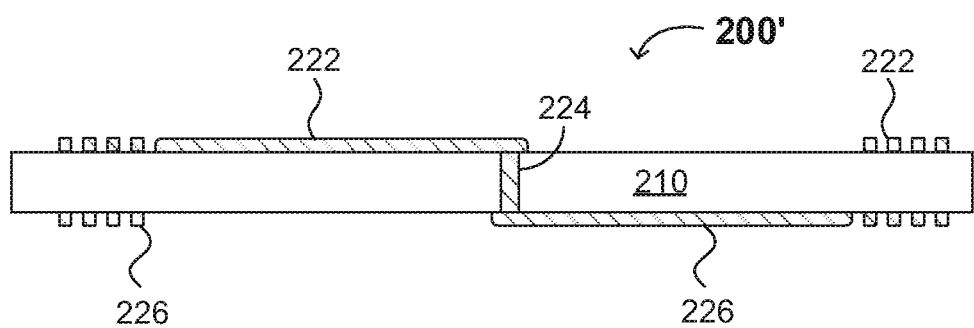
Figure 3D:
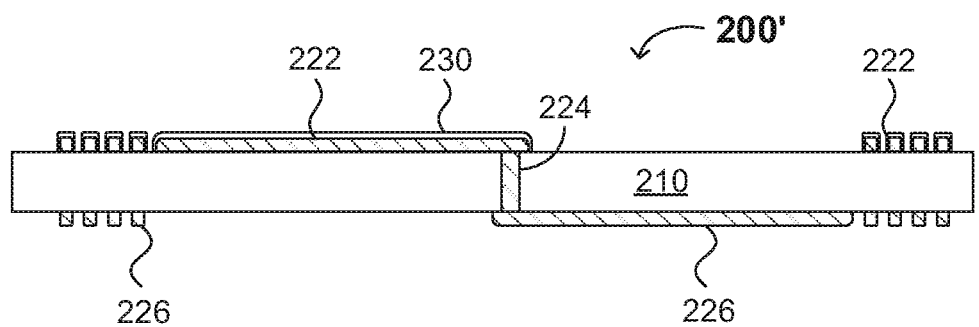
Figure 3E:
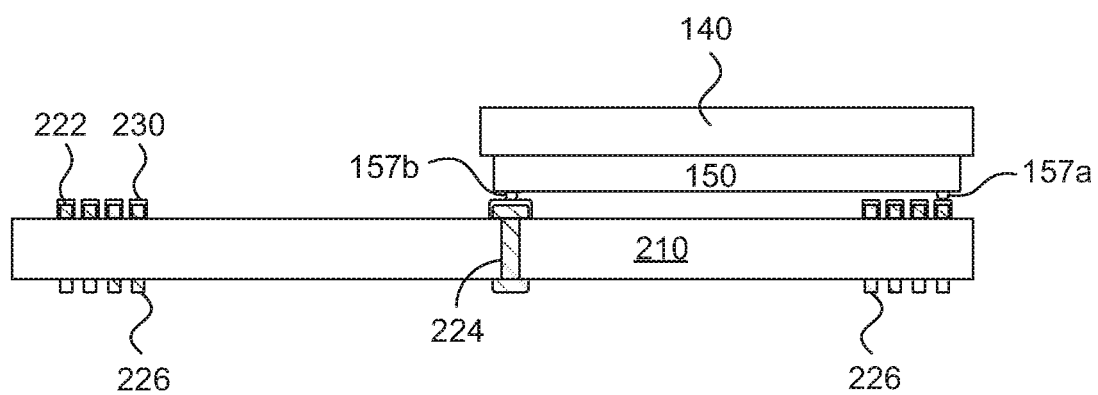
FIG. 3E shows a cross-sectional view of another exemplary electronic device having a layer of tin or other adhesion-promoting metal or alloy on an antenna and/or metal trace(s) in accordance with one or more embodiments of the present invention.

FIGS. 3A-3D show cross-sectional views of other exemplary intermediates in another exemplary process, and FIG. 3E shows a cross-sectional view of an another exemplary electronic device having a surface layer of tin on an aluminum antenna, in accordance with one or more embodiments of the present invention. The electronic device generally includes a substrate having a first metal layer (e.g., aluminum) 222 on a first surface and another first metal layer 226 on an opposite surface, an integrated circuit or discrete electrical component 150 on a second substrate, the integrated circuit or discrete electrical component 150 being configured to (i) process a first signal and/or information therefrom, and (ii) generate a second signal and/or information therefor, electrical connectors 157a-b on input and/or output terminals of the integrated circuit or discrete electrical component, and a second metal layer 230 on the first metal layer 222, the second metal layer 230 configured to improve the adhesion and/or electrical connectivity of the first metal layer 222 to the electrical connectors 157a-b, the electrical connectors 157a-b being electrically connected to at least the second metal layer 230. In various embodiments, the integrated circuit may comprise a thin film integrated circuit or a printed integrated circuit, and the discrete electrical component may comprise or consist of a capacitor, an inductor, a resistor, a switch, etc. In further or other embodiments, the electronic device is a wireless communication device.

FIG. 3A shows a first substrate 210 having first metal layers (e.g., aluminum layers) 220, 225 on the first and second surfaces of the substrate 210, respectively. The first metal layers 220 and/or 225 may comprise a patterned or blanket aluminum layer (e.g., a patterned or unpatterned aluminum foil). In various embodiments, the aluminum layers 220 and/or 225 may consist essentially of elemental aluminum or may comprise or consist essentially of an aluminum alloy, as described herein. Generally, the aluminum layers 220 and/or 225 have a thickness of at least 10 µm. In various embodiments, the first substrate 210 may comprise an insulative substrate (e.g., a plastic film or glass), as described herein. In further embodiments, the first substrate 210 may comprise a food-compatible insulative substrate, such as poly(ethylene-vinyl alcohol) (e.g., an EVAL film, commercially available from Kuraray Co., Ltd., Tokyo, Japan).

FIG. 3B shows an antenna and/or trace(s) 222 formed from the first metal layer 220 of FIG. 3A on the first surface of the first substrate 210. Generally, the antenna 222 is configured to (i) receive and (ii) transmit or broadcast wireless signals. In some embodiments, the antenna 222 may consist of a single metal layer on the first surface of the first substrate 210. The antenna 222 may have any of various shapes or forms, including spiral, serpentine, sheet or block, and when it is spiral, it may have any number of loops (e.g., at least 2, 4, 6, 8, etc.). In one embodiment, the first metal layer 225 on the second (opposite) surface of the first substrate 210 is a blanket-deposited film 225, formed by sputtering or evaporation, for example. The metal layer 225 generally coats or laminates the insulative substrate 210.

In various embodiments, the first metal layer 222 may comprise a patterned aluminum layer (e.g., a patterned aluminum foil) on the first surface of the first substrate 210.

The antenna 222 may be a printed antenna or a blanket-deposited and patterned antenna, as described herein. The printed antenna (and/or any aluminum traces that may be present) 222 may have a line width of from about 50 µm to about 5000 µm, and may have a crystallinity and/or film morphology different from a blanket-deposited, photolithographically-defined and etched antenna, as described herein. The antenna 222 may have a size and shape that matches any of multiple form factors, while preserving compatibility with a target frequency or a frequency specified by one or more industry standards (e.g., the 13.56 MHz target frequency of NFC reader hardware).

In an alternative embodiment, FIG. 3C shows an antenna and/or trace(s) 226 formed on a second surface of the first substrate 210 from the first metal layer 225 of FIGS. 3A-B (e.g., by patterning and etching) or by printing directly onto the second surface of the substrate 210. In such embodiments, one or more vias 224 may be formed in the first substrate 210 prior to forming antenna and/or trace(s) 222 to provide electrical connections between the antenna and/or trace(s) 222 on the first surface of the first substrate 210 and the antenna 226 on the second surface of the first substrate 210.

Typically, the antenna 226 is configured to (i) receive and (ii) transmit or broadcast wireless signals, either alone (when coupled through one or more [generally two] vias 224 to traces 222 on the first surface of the first substrate 210) or together with the antenna 222 (when coupled through one or more [generally two] vias 224 to the antenna 222 on the first surface of the first substrate 210). In some embodiments, the antenna 226 may consist of a single metal layer on the second surface of the first substrate 210. The antenna 226 may various shapes or forms, including spiral, serpentine, sheet or block, and when it is spiral, it may have any number of loops, as described herein.

In various embodiments, the antenna 226 may be a printed antenna or a blanket-deposited and patterned antenna as described herein. The printed antenna (and/or any aluminum traces that may be present) 226 may have a line width of from about 50 µm to about 5000 µm, and may have a crystallinity and/or film morphology different from a blanket-deposited photolithographically-defined and etched antenna, as described herein. The antenna 226 may have a size and shape that matches any of multiple form factors, while preserving compatibility with the target frequency or a frequency specified by one or more industry standards (e.g., the 13.56 MHz target frequency of NFC reader hardware).

FIG. 3D shows an exemplary second metal layer 230 on the antenna 222 on the first surface of the substrate 210. In exemplary embodiments, the second metal 230 comprises a tin layer on the first metal (e.g., aluminum) layer 220, as described herein. For example, tin does not oxidize like copper, so it does not require an organic copper protector (OCP), which limits the type of conductive material used in SMD processing to protect the surface of the underlying metal (e.g., first metal layer 222). Additionally, tin is a relatively low cost metal and is food compatible. Thus, the present invention reduces the cost and processing time of electronic devices such as smart labels and NFC, RF, HF and UHF tags, and is compatible with food products.

In various embodiments, the second metal layer 230 is on the first surface of the first substrate 210. In one embodiment, the second layer 230 is deposited by an immersion plating process. Alternatively, the second metal layer 230 may be printed. When the second metal layer 230 comprises tin, it may comprise or consist essentially of a tin alloy, as described herein. The second metal layer 230 may have a thickness of 0.1 µm to 10 µm. The second metal layer 230 may be formed on both patterned first metal layers 222 and 226, but when an IC or discrete electrical component is attached to only a single surface of the substrate 210, the second metal layer 230 may be formed only on one side or surface of the substrate 210.

FIG. 3E shows the integrated circuit or discrete electrical component 150 on the second substrate 140 of FIGS. 2D-2F, connected to the tin-plated antenna 222/230 on the first substrate 210. In some embodiments, electrical connectors 157a, 157b may be on input and/or output terminals of the integrated circuit or discrete electrical component 150, as described herein. The integrated circuit or discrete electrical component 150 can be attached to the coated antenna or trace 222/230 using a stud bump and ACP, or a printed bump and ACP. Thus, the electrical connectors 157a, 157b may comprise solder bumps or solder balls, which may be printed on the input and/or output terminals of the integrated circuit 150 as described herein. The solder bumps or solder balls 157a, 157b may include a solder alloy (e.g., tin and one or more alloying elements as described herein) on the input and/or output terminals, as described herein.

Figure 4:
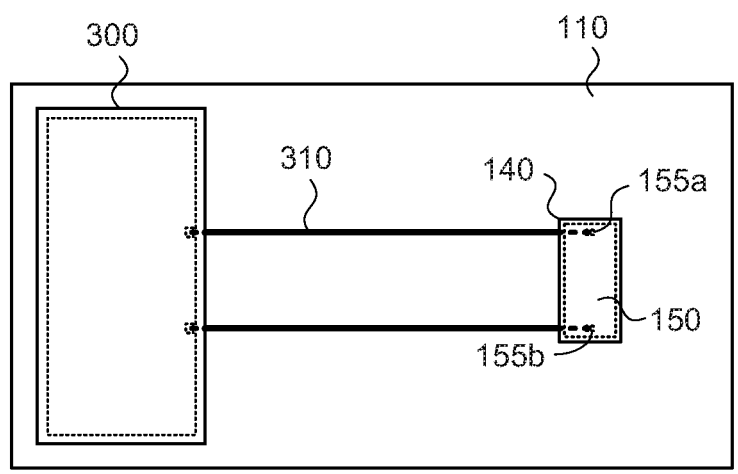
FIG. 4 shows a cross-sectional view of an exemplary electronic device having a sensor, a battery or a display on a first substrate in accordance with one or more embodiments of the present invention.

In some embodiments, at least one trace 310 (FIG. 4) is also on the first substrate 110 (see, e.g., FIGS. 2A-2F and FIG. 4) or 210 (see, e.g., FIGS. 3A-3E). As shown in FIG. 4, a sensor, a battery, and/or a display 300 may be on the first substrate 110 and attached to one or more of the traces 310 and electrically connected to the input and output terminals 155a, 155b of the integrated circuit or discrete electrical component 150 on the second substrate 140, as described herein.

CONCLUSION

The present electronic device and method of manufacturing the same advantageously improves mechanical smoothness (e.g., for adhesion) and electrical contact or connectivity of metals commonly used for antennas and traces on thin film or printed integrated circuit backplanes. Other advantages of the present invention include the following. A high Q NFC device may be formed due to a relatively thick aluminum antenna. Forming contacts between an aluminum antenna or trace and a thin film or printed IC using a tin solder or any other conductive material is relatively easy. Thus, a variety of components, such as discrete capacitors, inductors, or switches, can be assembled with solder, which is robust and reliable. Furthermore, other components, such as batteries, sensors, or displays, which require a low temperature process can be attached with a variety of conductive adhesives.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application. It is intended that the scope of the invention be defined by the claims appended hereto and their equivalents.

What is claimed is:

1. A method of manufacturing an electronic device, comprising:
   a) forming an aluminum layer on a first substrate;
   b) forming an integrated circuit or a discrete electrical component on a second substrate, the integrated circuit or discrete electrical component having (i) an uppermost metal layer and (ii) input and/or output terminals in the uppermost metal layer;
   c) forming solder bumps or solder balls on the input and/or output terminals of said integrated circuit or said discrete electrical component;
   d) forming a tin or tin alloy layer on an entire exposed surface of said aluminum layer, said tin or tin alloy layer improving adhesion and/or electrical connectivity of said aluminum metal layer to said solder bumps or solder balls on said integrated circuit or said discrete electrical component;
   e) forming a sensor, a battery or a display on said first substrate; and
   f) after forming the tin or tin alloy layer on the entire exposed surface of the aluminum layer, electrically connecting said solder bumps or solder balls to said tin or tin alloy layer, wherein said aluminum and tin or tin alloy layers comprise one or more traces electrically connecting the sensor, the battery or the display to said integrated circuit, said discrete electrical component, or to another of said sensor, said battery or said display.

2. The method of claim 1, wherein forming said aluminum layer comprises depositing said aluminum layer on a first surface of said first substrate.

3. The method of claim 1, wherein forming said tin or tin alloy layer comprises an immersion plating process.

4. The method of claim 1, wherein forming the integrated circuit or discrete electrical component comprises printing one or more layers of the integrated circuit or discrete electrical component on the second substrate.

5. The method of claim 1, further comprising depositing an adhesive on the input and/or output terminals.

6. The method of claim 1, wherein the solder bumps or balls comprise a first solder bump or ball on a first input/output terminal of said integrated circuit and a second solder bump or ball on a second input/output terminal of said integrated circuit.

7. The method of claim 6, wherein electrically connecting said solder bumps or balls to said tin or tin alloy layer comprises heating and pressing said first and second solder bumps or balls to the tin or tin alloy layer at first and second locations on the tin or tin alloy layer.

8. An electronic device, comprising:
   a) a substrate having an aluminum layer thereon;
   b) an integrated circuit or a discrete electrical component on a second substrate, said integrated circuit or said discrete electrical component having an uppermost metal layer and input and/or output terminals in the uppermost metal layer and being configured to (i) process a first signal and/or information therefrom, and (ii) generate a second signal and/or information therefor;
   c) solder bumps or solder balls on the input and/or output terminals of said integrated circuit or said discrete electrical component;
   d) a tin or tin alloy layer on an entire exposed surface of said aluminum layer, said tin or tin alloy layer configured to improve the adhesion and/or electrical connectivity of said aluminum layer to said solder bumps or solder balls on said integrated circuit or said discrete electrical component, said solder bumps or solder balls being electrically connected to said tin or tin alloy layer; and e) a sensor, a battery or a display on said first substrate, wherein said aluminum and tin or tin alloy layers comprise one or more traces electrically connecting said sensor, said battery or said display to said integrated circuit, said discrete electrical component, or to another of said sensor, said battery or said display.

9. The device of claim 8, wherein said electronic device is a wireless communication device.

10. The device of claim 8, wherein said aluminum layer is on a first surface of said first substrate.

11. The device of claim 8, wherein said second substrate comprises (i) a metal foil having a diffusion barrier and/or insulator film thereon, or (ii) a plastic.

12. The device of claim 8, wherein the integrated circuit or discrete electrical component comprises one or more printed layers.

13. The device of claim 8, wherein the solder bumps or solder balls comprise a first solder bump or ball on a first input and/or output terminal and a second solder bump or ball on a second input and/or output terminal.

14. The device of claim 13, further comprising an adhesive on the first and second input and/or output terminals.

15. The device of claim 8, further comprising a sensor on said first substrate, electrically connected to said integrated circuit or discrete electrical component.

16. The method of claim 1, wherein forming said tin or tin alloy layer comprises printing said tin or tin alloy layer on said aluminum layer.

17. The method of claim 1, wherein the input and/or output terminals comprise aluminum, tungsten, copper, silver, or a combination thereof.

18. The device of claim 8, wherein said tin or tin alloy layer comprises a printed tin or tin alloy layer.

19. The device of claim 8, wherein the input and/or output terminals comprise aluminum, tungsten, copper, silver, or a combination thereof.

* * * * *